United States Patent
Su et al.

(10) Patent No.: US 9,620,934 B2
(45) Date of Patent: Apr. 11, 2017

(54) FLIP-CHIP ASSEMBLY COMPRISING AN ARRAY OF VERTICAL CAVITY SURFACE EMITTING LASERS (VCSELS)

(75) Inventors: Chung-Yi Su, Cupertino, CA (US); Tak K. Wang, Cupertino, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 1464 days.

(21) Appl. No.: 12/873,144

(22) Filed: Aug. 31, 2010

(65) Prior Publication Data

US 2012/0051685 A1    Mar. 1, 2012

(51) Int. Cl.
*H01S 5/042* (2006.01)
*H01S 5/42* (2006.01)
*H01S 5/022* (2006.01)

(52) U.S. Cl.
CPC ............ *H01S 5/423* (2013.01); *H01S 5/0224* (2013.01); *H01S 5/02252* (2013.01); *H01S 5/02272* (2013.01); *H01S 5/02276* (2013.01); *H01S 5/02284* (2013.01)

(58) Field of Classification Search
CPC .... H01S 5/0224; H01S 5/02252; H01S 5/423; H01S 5/02272
USPC ........................................ 372/34, 36, 50.124
See application file for complete search history.

(56) References Cited

U.S. PATENT DOCUMENTS

| | | | |
|---|---|---|---|
| 6,526,205 B1 | 2/2003 | Wilson et al. | |
| 6,636,653 B2 * | 10/2003 | Miracky et al. | 385/14 |
| 6,658,041 B2 | 12/2003 | Uebbing | |
| 6,670,599 B2 | 12/2003 | Wagner et al. | |
| 6,800,946 B2 * | 10/2004 | Chason et al. | 257/778 |
| 7,271,461 B2 | 9/2007 | Dutta | |
| 8,399,292 B2 | 3/2013 | Doany et al. | |
| 2001/0007372 A1 * | 7/2001 | Akram et al. | 257/724 |
| 2002/0089067 A1 | 7/2002 | Crane et al. | |
| 2002/0154667 A1 * | 10/2002 | Shimonaka | 372/50 |
| 2003/0026303 A1 * | 2/2003 | Ouchi | 372/36 |
| 2008/0013959 A1 | 1/2008 | Ishigami | |
| 2011/0044369 A1 * | 2/2011 | Andry et al. | 372/50.124 |
| 2012/0051685 A1 | 3/2012 | Su et al. | |

FOREIGN PATENT DOCUMENTS

WO    2013054249 A3    4/2013

\* cited by examiner

*Primary Examiner* — Michael Carter

(57) ABSTRACT

A known flip-chip assembly manufacturing process is augmented by process steps of the invention to create a VCSEL flip-chip assembly comprising a plurality of semiconductor devices having respective arrays of a small number of VCSELs thereon, which are mounted on a substrate to form a large array of VCSELs that are precisely optically aligned with their respective optical coupling elements.

17 Claims, 9 Drawing Sheets

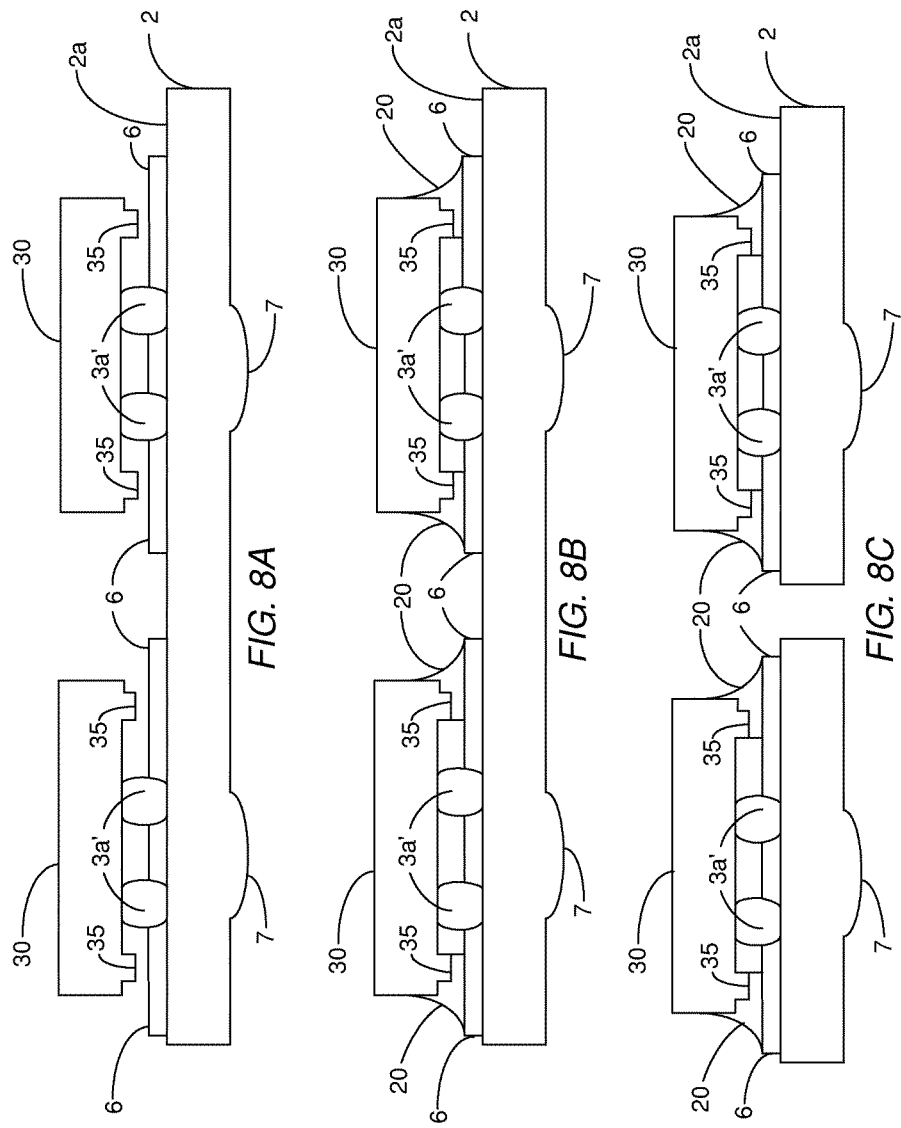

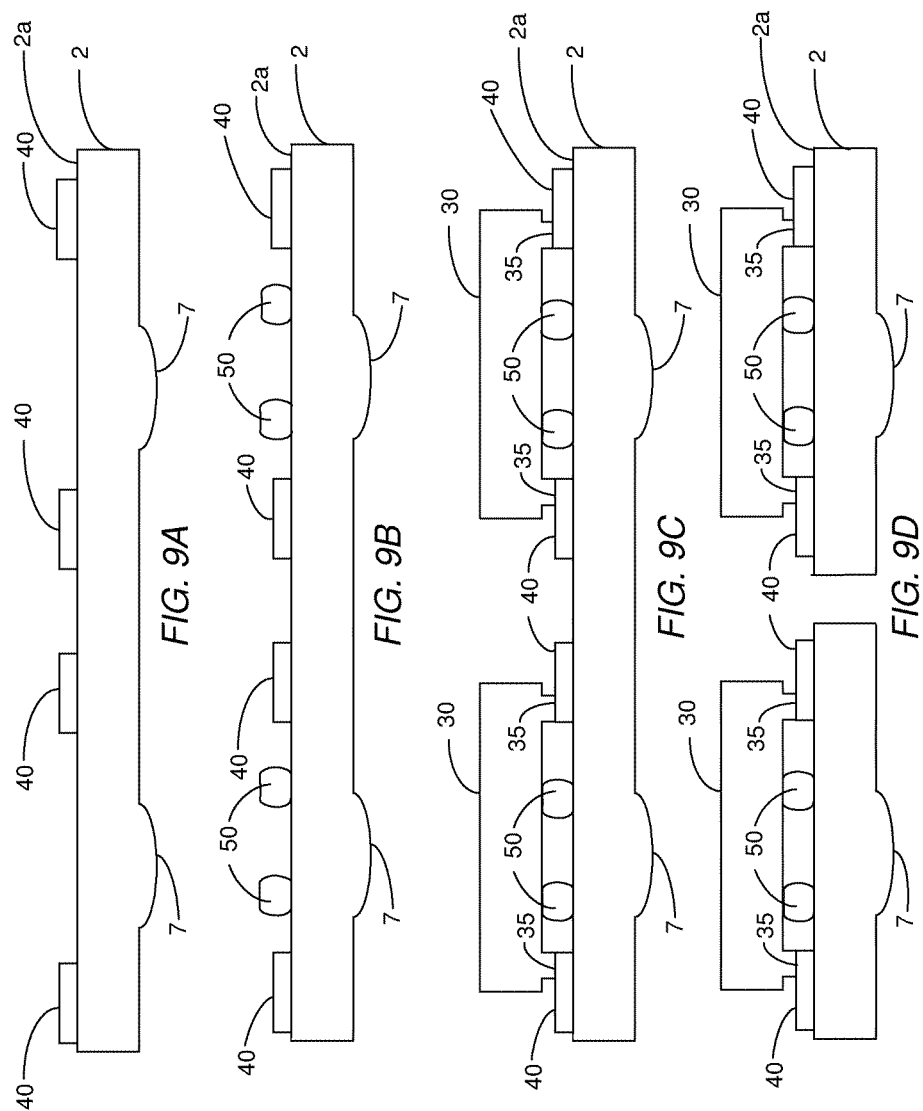

FLIP-CHIP ASSEMBLY COMPRISING AN ARRAY OF VERTICAL CAVITY SURFACE EMITTING LASERS (VCSELS)

TECHNICAL FIELD OF THE INVENTION

The invention relates to semiconductor lasers, and more particularly, to a flip-chip assembly comprising an array of vertical cavity surface emitting lasers (VCSELs).

BACKGROUND OF THE INVENTION

In optical communications networks, optical transceiver and transmitter modules are used to transmit optical signals over optical fibers. The optical transceiver or transmitter module includes a laser that generates amplitude modulated optical signals that represent data, which are then transmitted over an optical fiber coupled to the transceiver or transmitter module. Various types of semiconductor lasers are typically used for this purpose, including, for example, VCSELs and edge emitting lasers, which may be further divided into subtypes that include Fabry Perot (FP) and Distributed Feedback (DFB) lasers.

Some optical transmitter or transceiver modules have only a single transmit channel comprising a single laser, which is sometimes referred to as a singlet. Other optical transmitter or transceiver modules have multiple transmit channels comprising multiple lasers. The multi-channel optical transmitter or transceiver module is commonly referred to as a parallel optical transmitter or transceiver module.

There is an ever-increasing demand for optical transmitter or transceiver modules that have increasingly larger numbers of transmit channels. Of course, increasing the number of transmit channels allows the bandwidth capacity of an optical communications network to be increased. In order to meet this demand, it is known to fabricate an array of lasers on a single semiconductor substrate of the electrical subassembly (ESA) of the module. For example, it is known to fabricate a one-dimensional or two-dimensional array of VCSELs on a single semiconductor substrate. Fabricating the VCSELs on a single semiconductor substrate allows the spacing, or pitch, between adjacent VCSELs to be decreased, which, in turn, allows the number of VCSELs that can be integrated on a single semiconductor substrate to be increased. However, the manufacturing yield for this type of semiconductor device is relatively low due to the fact that the semiconductor device is deemed defective and is discarded if even one of the VCSELs of the array is found to be defective. The relatively low manufacturing yield of this type of semiconductor device increases the overall costs of the semiconductor devices.

Because semiconductor devices that have fewer numbers of VCSELs on them can be manufactured with higher yield, and thus at reduced costs, it is known to construct an array of VCSELs by creating an array of multiple semiconductor devices that have either only a singlet VCSEL or a few VCSELs on them. This approach presents other difficulties, however, one of which is the difficulty associated with precisely aligning the VCSELs with their respective optical coupling elements. Consequently, to date, using multiple semiconductor devices having only either a singlet VCSEL or a very small number of VCSELs on them to create a larger array of VCSELs is not a viable solution.

Accordingly, a need exists for an assembly having multiple semiconductor devices with only either a singlet or a very small number of VCSELs on them that can be combined to create a precisely-aligned larger array of VCSELs.

SUMMARY OF THE INVENTION

The present invention is directed to a VCSEL flip-chip assembly. In accordance with one illustrative embodiment, the assembly comprises a substrate, a plurality of electrically conductive contact pads disposed on an upper surface of the substrate, and a plurality of VCSEL flip chips mounted on the upper surface of the substrate. The substrate is transparent to a particular wavelength of light produced by the VCSELs. The electrically conductive contact pads are disposed in flip chip mounting areas of the upper surface of the substrate. Each VCSEL flip chip is mounted in one of the respective mounting areas of the upper surface of the substrate. Each VCSEL flip chip includes a plurality of electrically conductive contact pads that are electrically coupled with respective contact pads disposed in the respective flip chip mounting areas of the upper surface of the substrate. Each VCSEL flip chip has at least one VCSEL that produces light of the particular wavelength and an aperture through which the light produced by the VCSEL passes out of the respective VCSEL flip chip. The VCSEL flip chips are mounted with the apertures of the respective VCSELs facing the upper surface of the substrate such that most if not all of the light passing out of the apertures enters the substrate.

In accordance with another illustrative embodiment, the VCSEL flip-chip assembly comprises a substrate, a plurality of electrically conductive contact pads disposed on an upper surface of the substrate, a plurality of VCSEL flip chips mounted on the upper surface of the substrate, and a plurality of electrically nonconductive encapsulations extending at least between an outer periphery of each respective VCSEL flip chip and the respective flip chip mounting area. The substrate is transparent to a particular wavelength of light produced by the VCSELs. The plurality of electrically conductive contact pads disposed on the upper surface of the substrate are located in flip chip mounting areas of the upper surface of the substrate. Each VCSEL flip chip is mounted in one of the respective mounting areas of the upper surface of the substrate. Each VCSEL flip chip includes a plurality of electrically conductive contact pads that are electrically coupled via solder bumps or balls with respective electrically conductive contact pads disposed in the respective flip chip mounting areas of the upper surface of the substrate. Each VCSEL flip chip has at least one VCSEL that produces light of the particular wavelength and a respective aperture through which the light produced by the VCSEL passes out of the respective VCSEL flip chip. The VCSEL flip chips are mounted with the apertures facing the upper surface of the substrate such that most if not all of the light passing out of the apertures enters the substrate.

In accordance with another illustrative embodiment, the VCSEL flip chip assembly comprises a substrate, a plurality of electrically conductive contact pads disposed on an upper surface of the substrate, a plurality of VCSEL flip chips mounted on the upper surface of the substrate, and a pattern of electrically nonconductive sealing compound disposed on the upper surface of the substrate beneath an outer periphery of each respective VCSEL flip chip. The substrate is transparent to a particular wavelength of light produced by the VCSELs. The plurality of electrically conductive contact pads disposed on the upper surface of the substrate are located in flip chip mounting areas of the upper surface of the substrate. Each VCSEL flip chip is mounted in one of the respective flip chip mounting areas of the upper surface of the substrate. Each VCSEL flip chip includes a plurality of electrically conductive contact pads that are electrically coupled via electrically conductive epoxy with respective electrically conductive contact pads disposed in the respective flip chip mounting areas of the upper surface of the substrate. Each VCSEL flip chip has at least one VCSEL that produces light of the particular wavelength and a respective aperture through which the light produced by the respective VCSEL passes out of the respective VCSEL flip chip. The VCSEL flip chips are mounted with the apertures facing the upper surface of the substrate such that most if not all of the light passing out of the apertures enters the substrate. The pattern of electrically nonconductive sealing compound disposed on the upper surface of the substrate beneath the outer peripheries of the respective VCSEL flip chips prevents ingression of contaminants into the respective optical pathways.

These and other features and advantages of the invention will become apparent from the following description, drawings and claims.

BRIEF DESCRIPTION OF THE DRAWINGS

FIGS. 8A-8C illustrate one embodiment for creating the VCSEL flip-chip assembly shown in FIGS. 1-5.

FIGS. 9A-9D illustrate another embodiment for creating the VCSEL flip-chip assembly shown in FIGS. 1-5.

DETAILED DESCRIPTION OF ILLUSTRATIVE EMBODIMENTS

The invention takes advantage of the fact that known flip-chip assembly manufacturing technology makes it possible to manufacture flip-chip assemblies with high precision, high manufacturing yield, and high throughput. The known flip-chip assembly manufacturing process is augmented by process steps of the invention to create a VCSEL flip-chip assembly comprising a plurality of semiconductor devices having one or more VCSELs thereon, which are mounted on a substrate to form a large array of VCSELs that are precisely optically aligned with their respective optical coupling elements. This feature prevents the aforementioned problems associated with manufacturing a semiconductor device having a large number of VCSELs thereon, or creating an array of VCSELs by assembling a plurality of semiconductor devices that have either a singlet VCSEL or a small number of VCSELs thereon. Consequently, the VCSEL flip-chip assemblies can be manufactured with high precision, high manufacturing yield, high throughput, and at relatively low costs. Embodiments of the invention will now be described with reference to FIGS. 1-9D.

Figure 1:
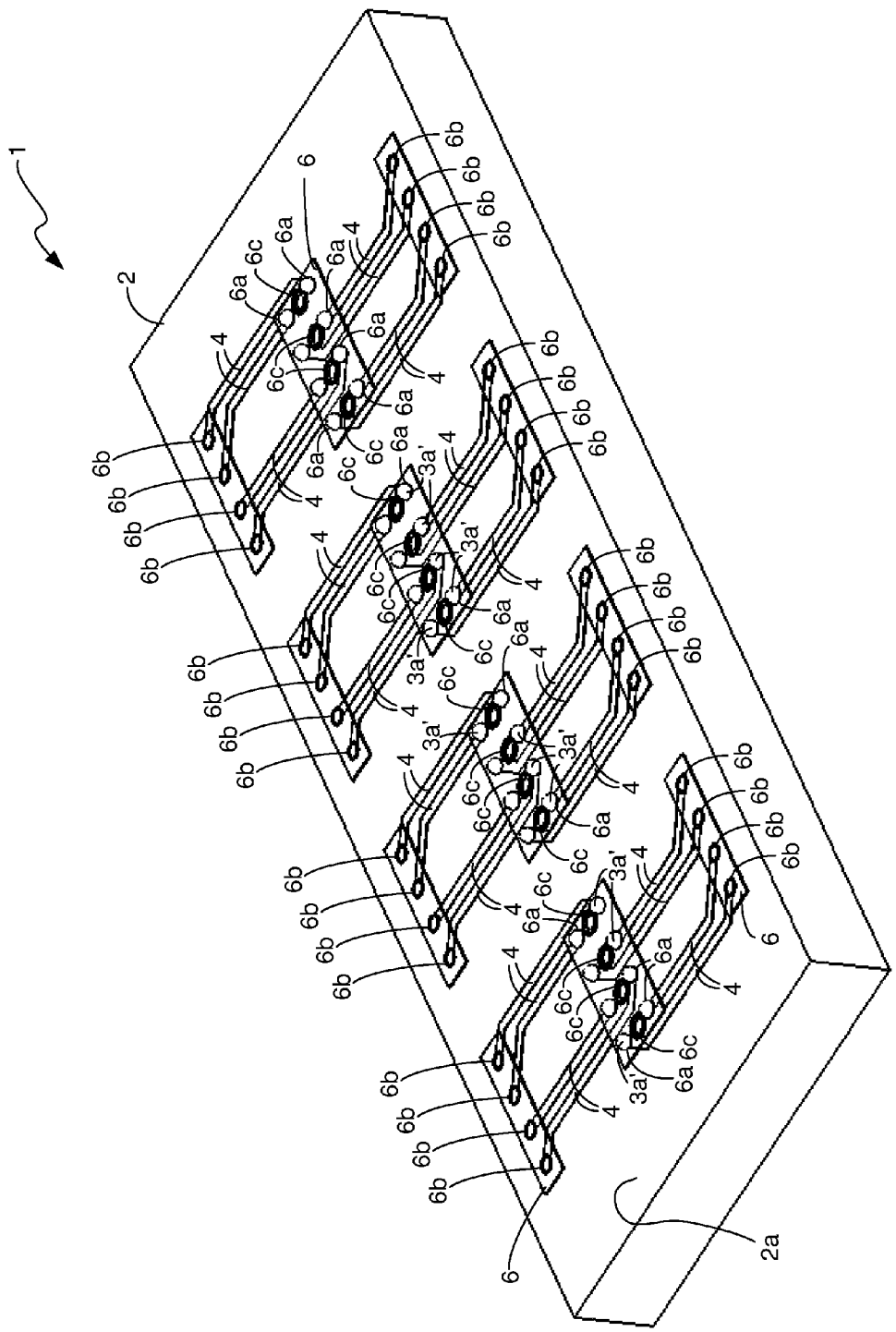
FIG. 1 illustrates a top perspective view of the VCSEL flip-chip assembly in accordance with an illustrative embodiment prior to VCSEL flip chips being mounted on an upper surface of a substrate of the assembly.
Figure 2:
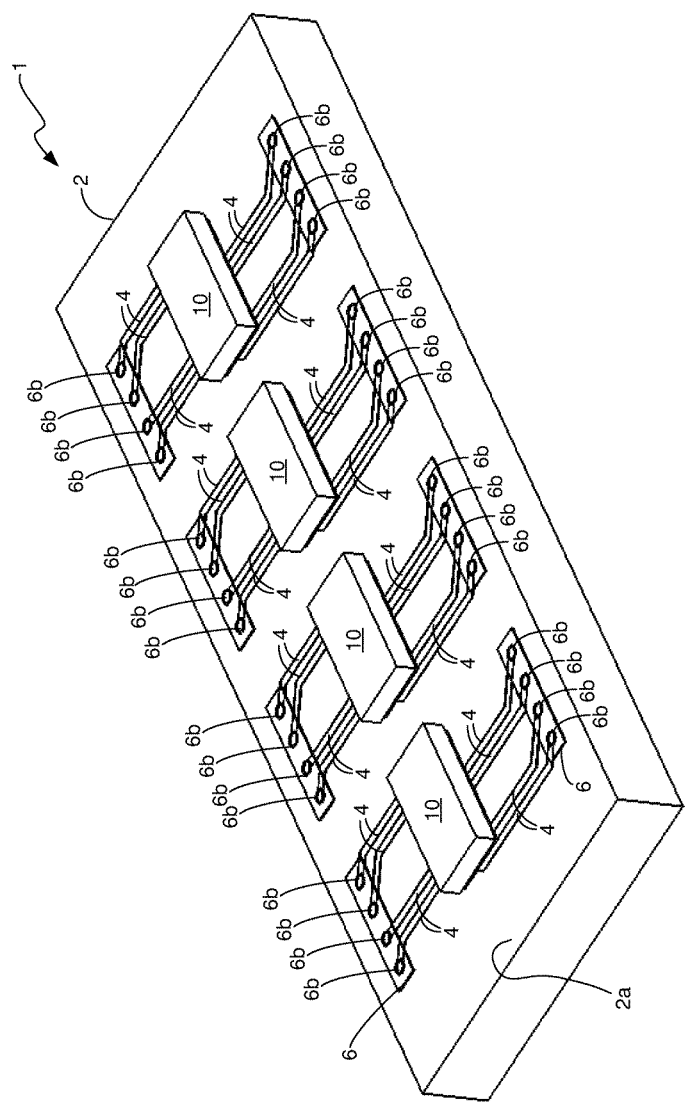
FIG. 2 illustrates a top perspective view of the VCSEL flip-chip assembly shown in FIG. 1 after a plurality of VCSEL flip chips have been mounted on the upper surface of the substrate of the assembly.
Figure 3:
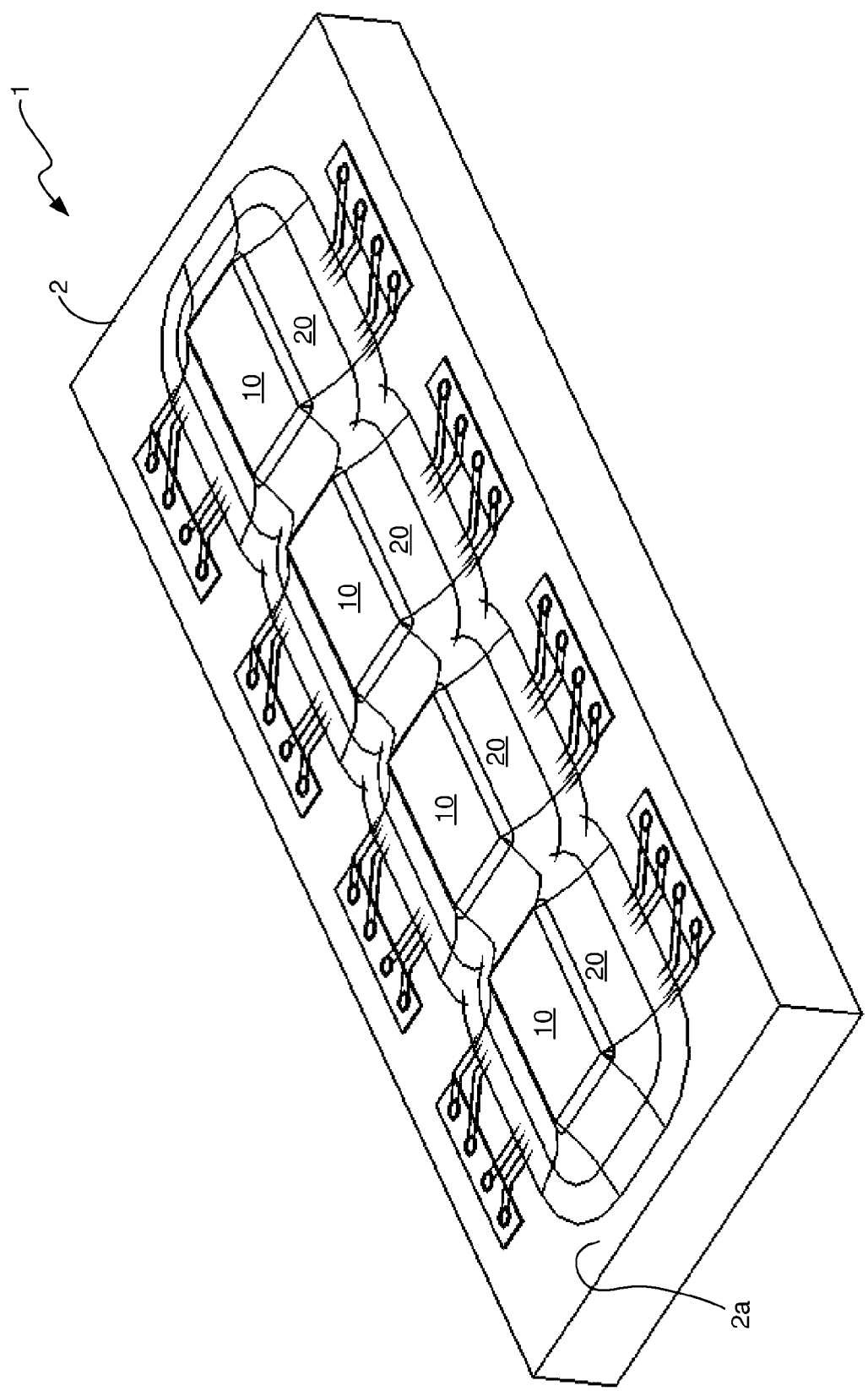
FIG. 3 illustrates a top perspective view of the VCSEL flip-chip assembly shown in FIG. 1 having the VCSEL flip chips mounted thereon and having respective encapsulations extending between the outer peripheries of the VCSEL flip chips and the upper surface of the substrate of the assembly.
Figure 4:
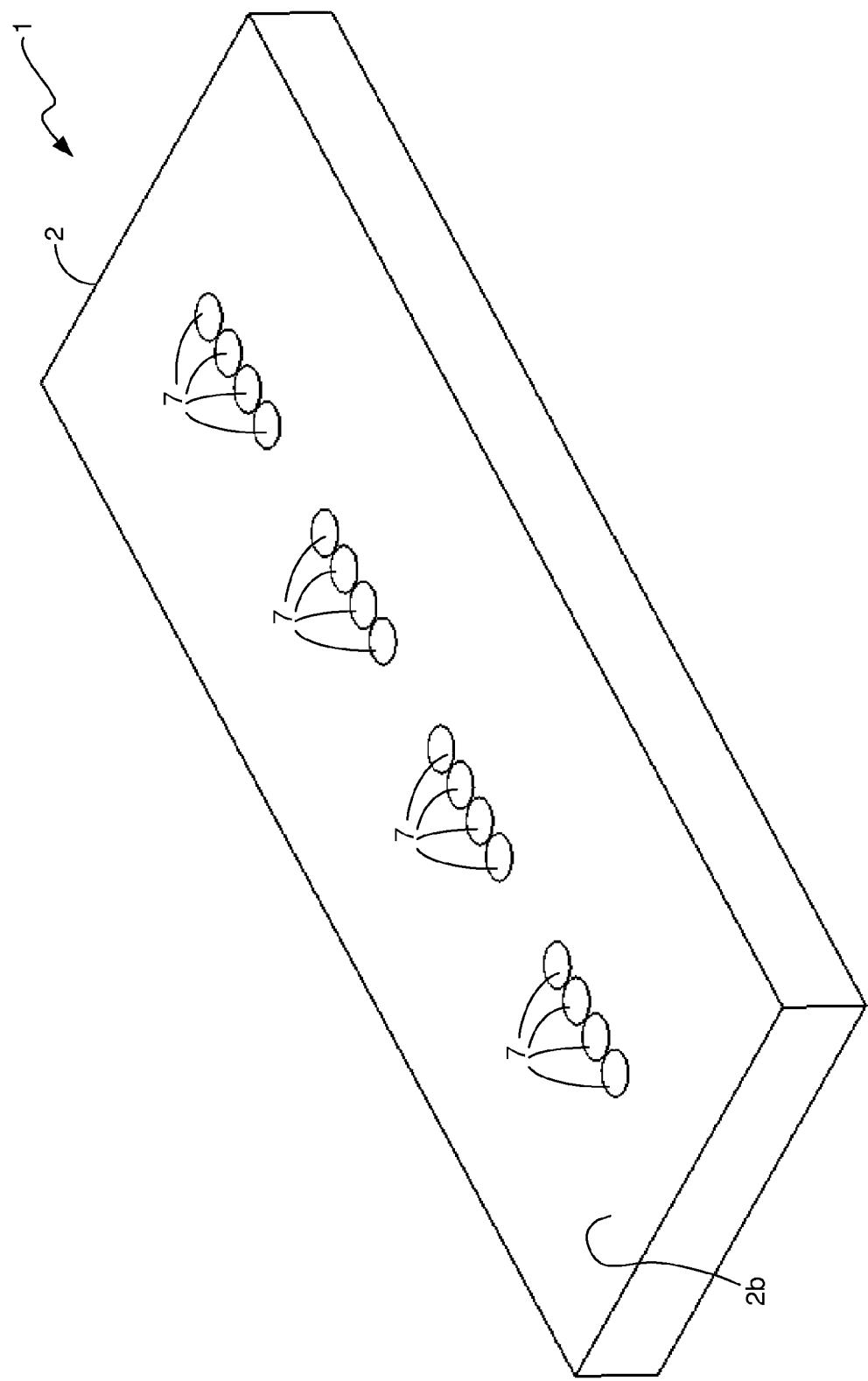
FIG. 4 illustrates a bottom perspective view of the VCSEL flip-chip assembly shown in FIG. 1 having optical coupling elements, which are typically diffractive or refractive lenses, formed on a lower surface of the substrate of the assembly.
Figure 5:
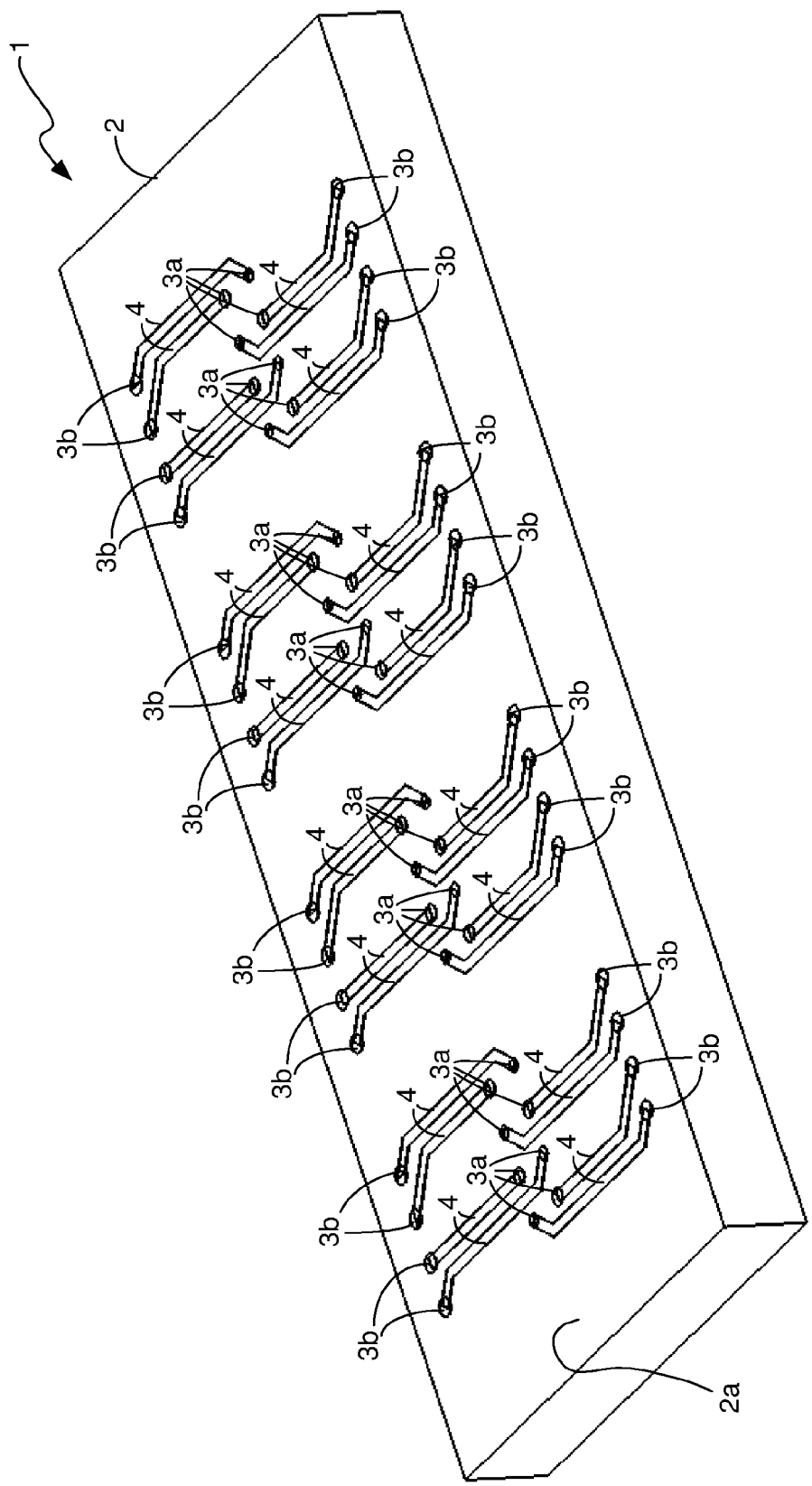
FIG. 5 illustrates a top perspective view of the VCSEL flip-chip assembly shown in FIG. 1 prior to the VCSEL flip chips and encapsulations being mounted thereon such that only electrical contact pads and electrical traces that are formed on the upper surface of the substrate can be seen.

FIG. 1 illustrates a top perspective view of the VCSEL flip-chip assembly 1 in accordance with an illustrative embodiment prior to VCSEL flip chips being mounted on an upper surface 2a of a substrate 2 of the assembly 1. FIG. 2 illustrates a top perspective view of the VCSEL flip-chip assembly 1 shown in FIG. 1 after a plurality of VCSEL flip chips 10 have been mounted on the upper surface 2a of the substrate 2 of the assembly 1. FIG. 3 illustrates a top perspective view of the VCSEL flip-chip assembly 1 shown in FIG. 1 having the VCSEL flip chips 10 mounted thereon and having respective encapsulations 20 extending between the outer peripheries of the VCSEL flip chips 10 and the upper surface 2a of the substrate 2 of the assembly 1. FIG. 4 illustrates a bottom perspective view of the VCSEL flip-chip assembly 1 shown in FIG. 1 having optical coupling elements 7, which are typically diffractive or refractive lenses, formed on or attached to a lower surface 2b of the substrate 2 of the assembly 1. FIG. 5 illustrates a top perspective view of the VCSEL flip-chip assembly 1 shown in FIG. 1 prior to the VCSEL flip chips 10 and encapsulations 20 being mounted thereon such that only electrical contact pads 3a and 3b and electrical traces 4 that are formed on the upper surface 2a of the substrate 2 can be seen. Various aspects of the assembly 1 will now be described with reference to FIGS. 1-5.

With reference to FIG. 5, first and second sets of electrically conductive contact pads 3a and 3b, respectively, and electrically conductive traces 4 are disposed on the upper surface 2a of the substrate 2. The first set of contact pads 3a are provided for making electrical connections with electrical contact pads (not shown for purposes of clarity) disposed on the lower surfaces of the VCSEL flip chips 10 (FIGS. 2 and 3). The substrate 2 is transparent to the wavelength of light that is produced by the VCSELs of the VCSEL flip chips 10 (FIGS. 2 and 3) such that optical signals produced by the VCSELs pass through the substrate 2. The first set of contact pads 3a is made up of a plurality of subsets of contacts pads 3a that are positioned in respective mounting areas of the upper surface 2a of the substrate 2. Each subset of contact pads 3a is disposed for making electrical connections with the electrical contact pads of the respective VCSEL flip chips 10 that are mounted in the respective mounting areas. In accordance with this illustrative embodiment, the VCSEL flip-chip assembly 1 has four VCSEL flip chips 10, and thus the substrate 2 has four mounting areas on its upper surface 2a. The invention, however, is not limited with respect to the number of VCSEL flip chips 10 that are mounted on the substrate 2 of the assembly 1.

The second set of electrically conductive contact pads 3b disposed on the upper surface 2a of the substrate 2 is provided for the purpose of electrically coupling the VCSEL flip chips 10 to VCSEL electrical driver circuitry (not shown for purposes of clarity). The electrically conductive traces 4 disposed on the upper surface 2a of the substrate 2 electrically connect the contact pads 3a to the contact pads 3b. The contact pads 3a have respective solder balls 3a' (FIG. 1) located thereon for electrically connecting the electrical contact pads 3a to respective electrical contact pads disposed on the lower surfaces of the VCSEL flip chips 10 during a solder reflow process, as will be described below in more detail. The electrical contact pads 3b (FIG. 5) may or may not have solder balls disposed on them for electrically connecting the traces 4 to the VCSEL driver circuitry, depending on whether wire bonding or soldering is used to make those connections.

In the illustrative embodiment of FIGS. 1-5, each VCSEL flip chip 10 includes a one-by-four array of VCSELs (not shown for purposes of clarity), although the VCSELs themselves cannot be seen in FIGS. 1-5 due to the fact that they are located on the lower surfaces of the flip chips 10, which are in abutment or in very close proximity to the upper surface 2a of the substrate 2. In other words, the VCSELs themselves are blocked from view in FIG. 1. It should be noted that each of the VCSEL flip chips 10 may include any number of VCSELs. Typically, each VCSEL flip chip 10 will include at least one VCSEL. Likewise, while the assembly 1 is shown as having four VCSEL flip chips 10 (FIGS. 2 and 3), the assembly 1 may have any number of VCSEL flip chips 10.

With reference to FIG. 1, a patterned layer 6 of dielectric material is disposed on the upper surface 2a of the substrate 2. In FIG. 5, the substrate 2 of the assembly 1 is depicted after the contacts pads 3a and 3b and the traces 4 have been formed on the upper surface 2a and before the patterned layer 6 of dielectric material has been formed on the upper surface 2a of the substrate 2. A comparison of FIG. 1 with FIG. 5 allows one to easily discern the shape of the patterned layer 6 of dielectric material. The patterned layer 6 has first and second sets of openings 6a and 6b (FIG. 1), respectively, formed therein for exposing the contact pads 3a and 3b (FIG. 5), respectively, formed on the upper surface 2a of the substrate 2. The patterned layer 6 has a third set of openings 6c (FIG. 1) formed therein, each of which exposes a respective area on the upper surface 2a of the substrate 2 to light passing out of a respective aperture of a respective VCSEL. During operations, optical signals produced by the respective VCSELs pass through the respective openings 6c and through the substrate 2 and are received by the respective refractive or diffractive optical coupling elements 7 (FIG. 4) disposed on the lower surface 2b of the substrate 2.

The optical coupling elements 7 optically couple the respective optical signals into respective ends of respective optical waveguides (not shown for purposes of clarity) that are mechanically coupled to the assembly 1. The optical waveguides that are used for this purpose are typically optical fibers. The optical coupling elements 7 may be formed in the substrate 2 or they may be formed in a separate optic that is then aligned and attached to the substrate. For example, the optical coupling elements 7 may be molded in a single piece of a plastic material that is then attached to the substrate 2.

The dielectric material that is used for the patterned layer 6 is an electrically insulating material that has a melting temperature that is higher than the melting temperature of the solder balls 3a'. Various dielectric materials are suitable for this purpose, such as, for example, Benzocyclobutene (BCB) polymeric material and various polyimide materials. For illustrative purposes, it will be assumed that the dielectric material of the patterned layer 6 is BCB polymeric material. Because the melting temperature of the patterned layer 6 is above that of the solder balls 3a', the patterned layer 6 will not melt or otherwise become damaged during the solder reflow process. The solder balls 3a' are typically made of gold-tin (AuSn) solder, although other suitable solder materials may be used for this purpose.

One of the potential difficulties associated with assembling the VCSEL flip-chip assembly 1 is that if proper precautions are not taken, contaminants and particulates can ingress into the openings 6c and partially or fully block the light paths between the apertures of the VCSELs and the respective optical coupling elements 7. After the Vcsel flip chips 10 have been mounted on the upper surface 2a of the substrate 2 (FIG. 2) and the solder reflow process has been performed to make the electrical interconnections between the electrical contact pads 3a and the electrical contact pads of the VCSELs, gaps exist between the lower surfaces of the flip chips 10 and the upper surface 2a of the substrate 2. If appropriate steps are not taken to seal these gaps, particulates and contaminants may pass through these gaps and enter the openings 6c, thereby potentially interfering with the light paths between the VCSELs and their respective optical coupling elements 7.

In accordance with the invention, an additional step is performed during the assembly process to seal these gaps. Specifically, subsequent to mounting the VCSEL flip chips 10 on the substrate 2 and performing the solder reflow process (FIG. 2), an encapsulation process is performed during which each VCSEL flip chip 10 is at least partially encapsulated in encapsulations 20 (FIG. 3), which comprise a sealing material such as epoxy, for example. The encapsulations 20 form seals that extend between the outer periphery of each flip chip 10 and the upper surface 2a of the substrate 2, as depicted in FIG. 3. These encapsulations 20 seal the aforementioned gaps and thereby prevent particulates and contaminants from entering the openings 6c.

Figure 6:
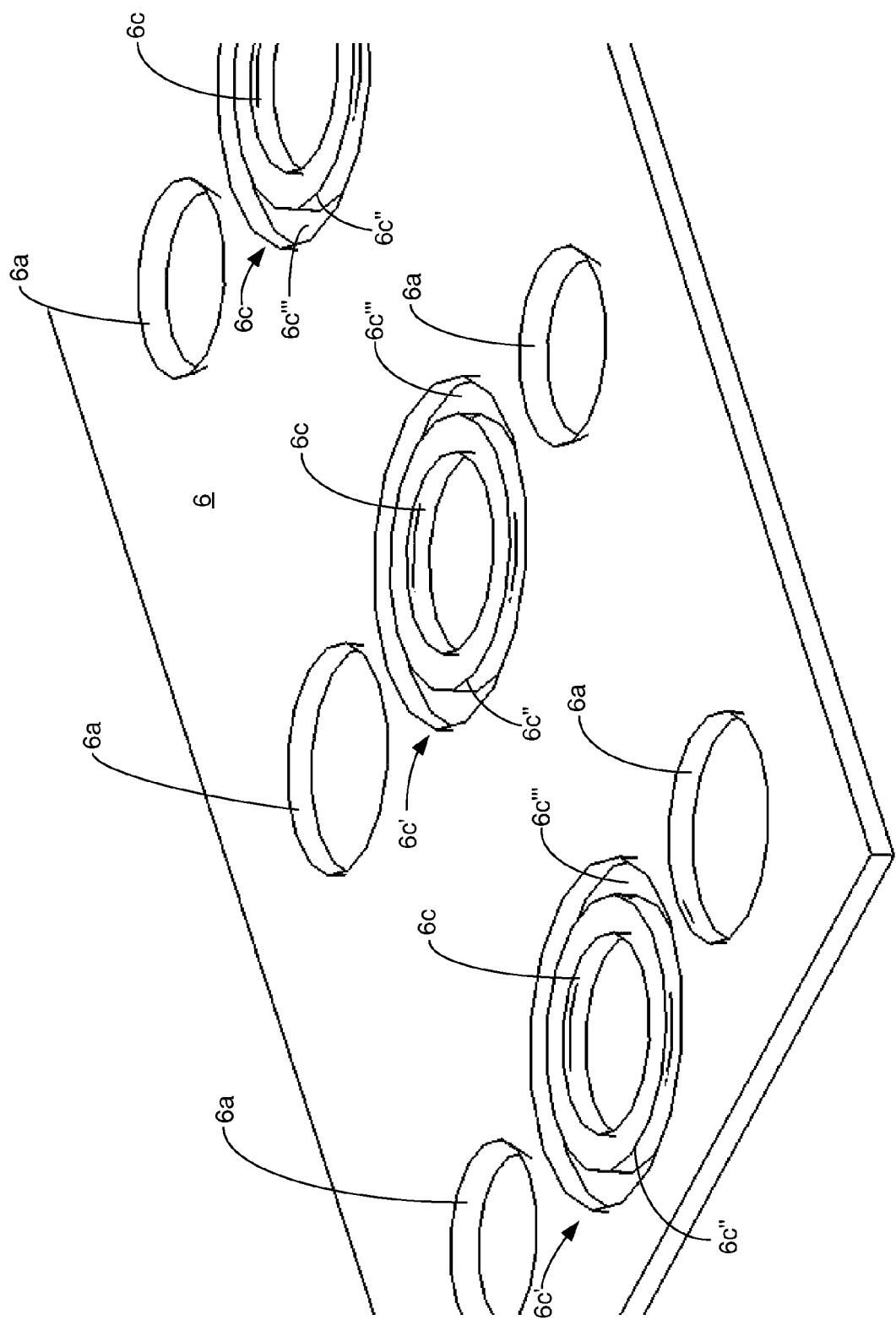
FIG. 6 illustrates an enlarged top perspective view of a portion of a patterned layer of dielectric material of the VCSEL flip-chip assembly shown in FIG. 1.

FIG. 6 illustrates an enlarged top perspective view of a portion of the patterned layer 6 shown in FIG. 1. The portion of the patterned layer 6 shown in FIG. 6 is the portion that is disposed over the mounting areas in which the VCSEL flip chips 10 are mounted (FIG. 2). While the encapsulations 20 prevent particulates and contaminants from interfering with the optical pathways, care must be taken to ensure that the material that is used for the encapsulations 20 does not flow into the openings 6c formed in the patterned layer 6 and interfere with the optical pathways. The patterned layer 6 helps prevent the material that is used for the encapsulations 20 from flowing into the openings 6c. Specifically, the openings 6c include dam regions 6c' (FIG. 6) that prevent excess encapsulation material from flowing onto the upper surface 2a of the substrate 2 and entering the optical pathway areas of the upper surface 2a that are defined by the openings 6c. In essence, the dam regions 6c' include barriers 6c" and reservoirs 6c''' that prevent excess encapsulation material from entering and potentially blocking the optical pathways between the VCSEL apertures and the optical coupling elements 7 (FIG. 4).

In addition, the patterned layer 6 facilitates alignment of the VCSELs with their respective optical coupling elements 7. During the solder reflow process, surface tension between the liquid solder and the openings 6a formed in the patterned layer 6 causes the solder balls 3a' (FIG. 1) to self-align with their respective electrical contact pads 3a (FIG. 5). As the solder balls 3a' begin to cool and harden, the tension between the solder balls 3a' and the respective contact pads (not shown for purposes of clarity) located on the lower surfaces of the VCSEL flip chips 10 (FIGS. 2 and 3) cause the VCSEL flip chips 10 to self-align with their respective mounting areas on the upper surface 2a of the substrate 2. This feature ensures that the apertures (not shown for purposes of clarity) of the respective VCSELs are precisely aligned with the respective openings 6c formed in the patterned layer 6.

Figure 7:
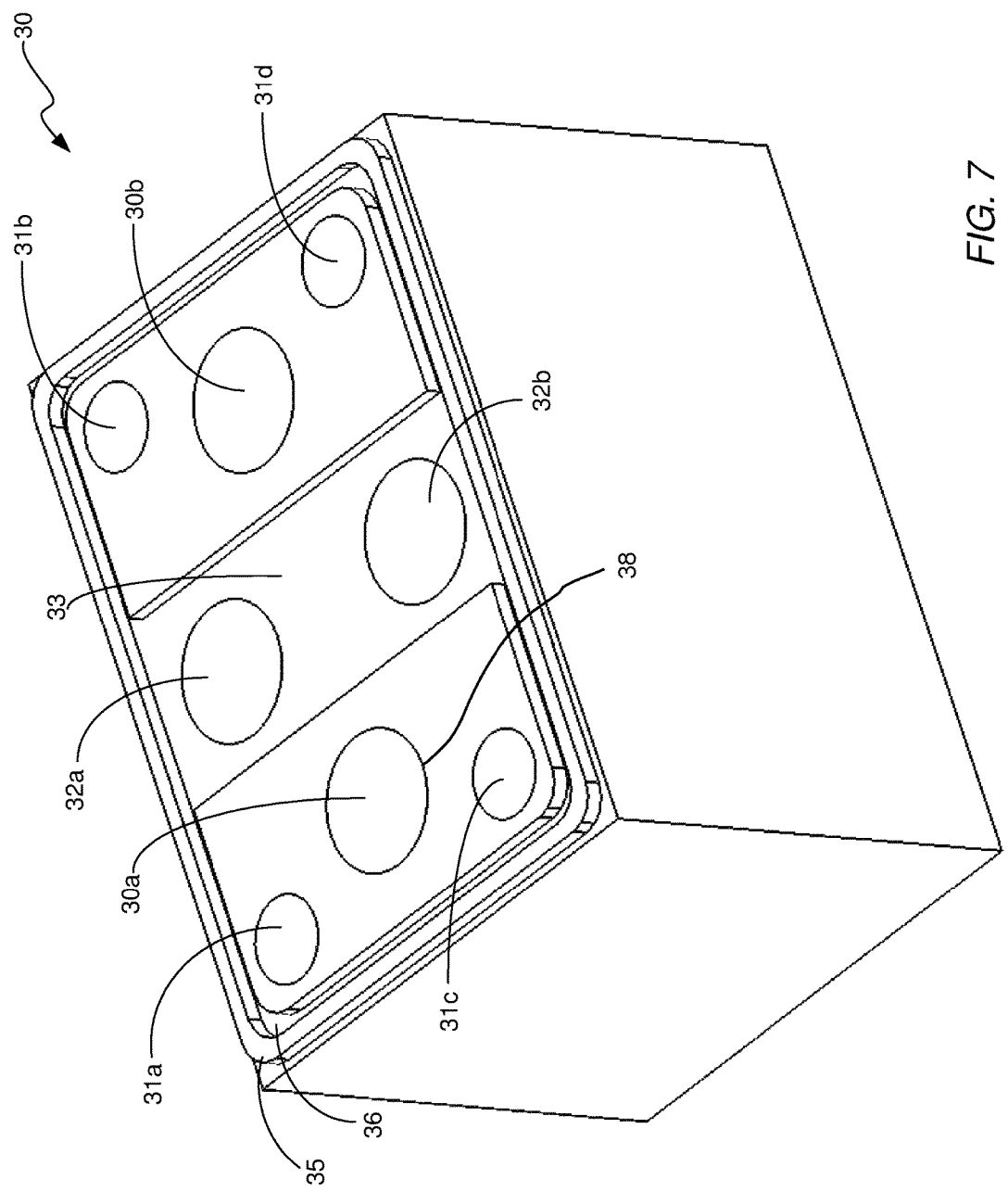
FIG. 7 illustrates a bottom perspective view of a VCSEL flip chip in accordance with an illustrative embodiment that has only two VCSELs and that may be used in the assembly shown in FIGS. 1-5.

In the illustrative embodiment described above, each VCSEL flip chip 10 has four VCSELs. As indicated above, the invention is not limited with respect to the number of VCSELs that are included in each VCSEL flip chip 10. FIG. 7 illustrates a bottom perspective view of a VCSEL flip chip 30 in accordance with an illustrative embodiment that has only two VCSELs 30a and 30b. The VCSEL flip chip 30 has four relatively small electrically conductive contact pads 31a-31d and two relatively large electrically conductive contact pads 32a and 32b formed on its lower surface 33. The two different sizes of contact pads 31a-31d and 32a-32b allow the VCSEL flip chip 30 to be used on substrates that have different configurations of contact pads thereon. In addition, in accordance with this illustrative embodiment, the VCSEL flip chip 30 has a ridge 35 and a groove 36 formed on its lower surface 33 that help prevent the material of which the encapsulation 20 is made from flowing onto the VCSELs 30a and 30b. This feature further ensures that the optical pathways remain unobstructed.

An illustrative embodiment of the assembly process that is used to create the assembly 1 will now be described with reference to FIGS. 8A-8C. In this illustrative embodiment, it will be assumed that the VCSEL flip chip 30 shown in FIG. 7 is implemented in the assembly 1, but otherwise it will be assumed that the assembly 1 has the features described above with reference to FIGS. 1-6. With reference to FIG. 8A, the substrate 2 of the assembly 1 is typically a portion of a glass wafer, although the wafer may comprise any suitable transparent material. The contact pads 3 a and 3 b and the traces 4 (FIG. 5) are placed on the upper surface 2 a of the substrate 2 using a known metallization process. After the metallization process has been performed, a known dielectric patterning process is used to form the patterned layer 6 of dielectric material on the upper surface 2 a of the wafer 2. A known solder placement process is then used to position the solder balls 3 a' (FIG. 1) on the respective contact pads 3 a (FIG. 5). A known flip-chip mounting process is then used to mount the respective flip chips 30 in the respective mounting areas on the upper surface 2 a of the substrate 2 such that the respective electrical contact pads (not shown for purposes of clarity) disposed on the lower surfaces of the flip chips 30 are in contact with the respective solder balls 3 a'. As indicated above, flip-chip mounting processes can be performed with very high precision, which ensures that the apertures 38 of the respective VCSELs 30 a and 30 b (FIG. 7) will be precisely aligned with the respective optical coupling elements 7 (FIG. 4)

After the flip chips 30 have been mounted on the substrate 2, a known solder reflow process is used to cause the solder to liquefy. When the solder liquefies, the surface tension between the liquefied solder bumps 3 a' and the surrounding dielectric material of the patterned layer 6 ensures that the flip chips 30 self-align with their respective mounting areas, which ensures that the apertures 38 of the respective VCSELs 30 a and 30 b self-align with the respective openings 6 c. The cooling and hardening of the solder bumps 3 a' fixes the flip chips 30 in their respective positions.

With reference to FIG. 8B, after the solder bumps 3a' have hardened, each of the flip chips 30 is at least partially covered in the encapsulating material 20 (FIGS. 2 and 3). Because the gaps between the ridges 35 and the patterned layer 6 of dielectric material are very small a well known effect called the capillary effect will cause the gaps to be filled very quickly with the encapsulation material, but will prevent encapsulation material from passing beyond the gaps. This feature further ensures that excess encapsulation material will not enter the openings 6c (FIG. 6) that define the entrances of the optical pathways.

With reference to FIG. 8C, after the encapsulation process has been performed, a singulation process is performed during which the wafer comprising the substrate 2 is singulated into individual VCSEL flip chip assemblies 1 of the type shown in FIG. 3. Each VCSEL flip-chip assembly 1 includes at least two flip chips, each of which includes at least one VCSEL. Thus, each of the resulting VCSEL flip chip assemblies 1 comprises an array of very precisely aligned VCSELs. In the example depicted in FIG. 1, the assembly 1 has sixteen VCSELs (four per flip chip 10) and therefore may be implemented in a parallel optical transmitter or transceiver module that has sixteen channels. If four VCSEL flip chips 30 of the type shown in FIG. 7 are used in the assembly 1, the assembly 1 has eight VCSELs (two per flip chip 30) and therefore may be implemented in a parallel optical transmitter or transceiver module that has eight channels. It should be noted that although only the VCSEL flip chip assembly 1 has only been described herein as having 1×N arrays of VCSELs, the assembly 1 could have an M×N array of VCSELs, where M and N are positive integers that are greater than 1. In other words, the assembly 1 could have a multi-dimensional rather than a one-dimensional array of VCSELs.

There can be hundreds or thousands of the assemblies 1 formed on a single substrate wafer. Therefore, the assembly process described above can be used to simultaneously create a very large number of the assemblies 1. This feature increases manufacturing yield and throughput, and consequently, reduces overall costs. In addition, because the VCSEL flip chips can be tested prior to being mounted on the substrate 2, it can be assured that any flip chip having a defective VCSEL is not used in the assembly 1, which improves manufacturing yield.

Another illustrative embodiment of the assembly process that is used to create the VCSEL flip-chip assembly 1 will now be described with reference to FIGS. 9A-9D. In accordance with this illustrative embodiment, it will be assumed that the VCSEL flip chip 30 shown in FIG. 7 is implemented in the assembly 1, but otherwise it will be assumed that the assembly 1 has the features described above with reference to FIGS. 1-6. A pattern of non-electrically conductive sealing compound 40 (FIG. 9A) is dispensed on the upper surface 2a of the substrate 2 adjacent the outer perimeter of the flip chip mounting areas, but outside of the electrical contact regions. The pattern sealing compound 40 may be dispensed in a very precise pattern using a screen printing process. The pattern of sealing compound 40 performs the same function as that performed by the encapsulation 20 described above, i.e., preventing ingression of contaminants into the optical pathways between the VCSEL apertures and the respective optical coupling elements 7. With respect to FIG. 9B, instead of using the solder balls 3a' (FIG. 1) to electrically connect the contact pads 31a-31d (FIG. 7) of the VCSEL flip chip 30 to the contact pads 3a (FIG. 5) disposed on the upper surface 2a of the substrate 2, an electrically conductive epoxy 50 is dispensed on the contact pads 31a-31d (FIG. 7), as depicted in FIG. 9B. The VCSEL flip chips 30 are then aligned with their respective mounting areas and mounted via a die attach process on the upper surface 2a of the substrate 2, as depicted in FIG. 9C. The conductive epoxy 50 and the pattern of nonconductive sealing compound 40 are then simultaneously cured. One benefit of this is that the curing process can be performed at a much lower temperature than soldering processes. The assemblies 1 are then singulated into individual assemblies 1 (FIGS. 2 and 3), as depicted in FIG. 9D.

It should be noted that the apparatuses and methods have been described with reference to a few illustrative embodiments for the purposes of demonstrating the principles and concepts of the invention and to provide a few examples of the manner in which they may be implemented. The methods and apparatuses are not limited to these embodiments, as will be understood by persons skilled in the art in view of the description provided herein.

What is claimed is:

1. A vertical cavity surface emitting laser (VCSEL) flip-chip assembly comprising:
    a substrate that is transparent to a particular wavelength of light, the substrate having an upper surface and a lower surface;
    a plurality of electrically conductive contact pads disposed on the upper surface of the substrate in flip chip mounting areas of the upper surface of the substrate;
    a plurality of VCSEL flip chips, each VCSEL flip chip being mounted in one of the respective flip chip mounting areas, each VCSEL flip chip including a plurality of electrically conductive contact pads, wherein respective electrically conductive contact pads of each VCSEL flip chip are electrically coupled with respective electrically conductive contact pads disposed in the respective flip chip mounting areas of the upper surface of the substrate, each VCSEL flip chip having at least one VCSEL that produces said particular wavelength of light and an aperture formed in a lower surface of the respective VCSEL flip chip through which the light produced by the VCSEL passes out of the respective VCSEL flip chip, and wherein the VCSEL flip chips are mounted with the apertures facing the upper surface of the substrate such that most if not all of the light passing out of the apertures enters the substrate; and
    a patterned layer of dielectric material disposed on the substrate, wherein the patterned layer includes a plurality openings aligned with the apertures of the VCSEL flip chips, each of the openings including a dam region, each dam region including a barrier and a reservoir surrounding the barrier.

2. The VCSEL flip-chip assembly of claim 1, wherein each VCSEL flip chip includes at least two VCSELs.

3. The VCSEL flip-chip assembly of claim 1, wherein each VCSEL flip chip includes at least four VCSELs.

4. The VCSEL flip-chip assembly of claim 1, wherein at least four VCSEL flip chips are mounted in the respective flip chip mounting areas of the upper surface of the substrate.

5. The VCSEL flip-chip assembly of claim 1, wherein the electrically conductive contact pads of the VCSEL flip chips and the electrically conductive contact pads disposed in the respective flip chip mounting areas are electrically coupled with each other via respective metal solder balls or bumps which self-align the VCSEL flip chips the respective flip chip mounting areas.

6. The VCSEL flip-chip assembly of claim 1, further comprising:
    a plurality of optical coupling elements disposed on the lower surface of the substrate in alignment with the respective apertures formed in the lower surfaces of the respective VCSEL flip chips, wherein the optical coupling elements are refractive optical coupling elements.

7. The VCSEL flip-chip assembly of claim 1, further comprising:
    a plurality of optical coupling elements disposed on the lower surface of the substrate in alignment with the respective apertures formed in the lower surfaces of the respective VCSEL flip chips, wherein the optical coupling elements are diffractive optical coupling elements.

8. The VCSEL flip-chip assembly of claim 1, further comprising:
    a plurality of optical coupling elements disposed on the lower surface of the substrate for receiving light produced by a respective VCSEL of a respective VCSEL flip chip that propagates along respective optical pathways between the respective VCSEL apertures and the respective optical coupling elements.

9. The VCSEL flip-chip assembly of claim 1, wherein each VCSEL of at least one of the VCSEL flip chips has associated therewith two of the electrically conductive contact pads of the VCSEL flip chip, the two electrically conductive contact pads associated with each VCSEL being formed on the lower surface of the respective VCSEL flip chip through which the light produced by the VCSEL passes out of the respective VCSEL flip chip.

10. The VCSEL flip-chip assembly of claim 1, further comprising a plurality of optical coupling elements disposed on the lower surface of the substrate in alignment with the respective apertures formed in the lower surfaces of the respective VCSEL flip chips.

11. A vertical cavity surface emitting laser (VCSEL) flip-chip assembly comprising:
    a substrate that is transparent to a particular wavelength of light, the substrate having an upper surface and a lower surface;
    a plurality of electrically conductive contact pads disposed on the upper surface of the substrate in flip chip mounting areas of the upper surface of the substrate;
    a plurality of VCSEL flip chips, each VCSEL flip chip being mounted in one of the respective flip chip mounting areas, each VCSEL flip chip including a plurality of electrically conductive contact pads, wherein respective electrically conductive contact pads of each VCSEL flip chip are electrically coupled with respective electrically conductive contact pads disposed in the respective flip chip mounting areas of the upper surface of the substrate, each VCSEL flip chip having at least one VCSEL that produces said particular wavelength of light and an aperture formed in a lower surface of the respective VCSEL flip chip through which the light produced by the VCSEL passes out of the respective VCSEL flip chip, and wherein the VCSEL flip chips are mounted with the apertures facing the upper surface of the substrate such that most if not all of the light passing out of the apertures enters the substrate; and
    a plurality of encapsulations that extend at least between an outer periphery of each respective VCSEL flip chip and the respective flip chip mounting area disposed on the upper surface of the substrate, the encapsulations comprising an electrically nonconductive material, wherein the encapsulations prevent ingression of contaminants into respective optical pathways between the respective apertures of the respective VCSELs and the upper surface of the substrate,
    wherein the electrically conductive contact pads of the VCSEL flip chips and the electrically conductive contact pads disposed in the respective flip chip mounting areas are electrically coupled with each other via respective metal solder balls or bumps, and wherein each VCSEL flip chip has a ridge that extends about the periphery of the respective VCSEL flip chip on the lower surface of the VCSEL flip chip, and wherein a gap exists between the ridge and the upper surface of the substrate that creates a capillary effect that helps prevent the encapsulation material from blocking the optical pathways between the apertures and the substrate.

12. The VCSEL flip-chip assembly of claim 11, wherein the electrically nonconductive material is epoxy.

13. The VCSEL flip-chip assembly of claim 11 further comprising:
a patterned layer of dielectric material disposed on the upper surface of the substrate in at least the flip chip mounting areas, the patterned layer having at least one set of openings formed therein through which the electrical contact pads disposed on the upper surface of the substrate are exposed and at least another set of openings formed therein that define entrances of the optical pathways.

14. The VCSEL flip-chip assembly of claim 11, wherein each VCSEL of at least one of the VCSEL flip chips has associated therewith two of the electrically conductive contact pads of the VCSEL flip chip, the two electrically conductive contact pads associated with each VCSEL being formed on the lower surface of the respective VCSEL flip chip through which the light produced by the VCSEL passes out of the respective VCSEL flip chip.

15. A vertical cavity surface emitting laser (VCSEL) flip-chip assembly comprising:
a substrate that is transparent to a particular wavelength of light, the substrate having an upper surface and a lower surface;
a plurality of electrically conductive contact pads disposed on the upper surface of the substrate in flip chip mounting areas of the upper surface of the substrate;
a plurality of VCSEL flip chips, each VCSEL flip chip being mounted in one of the respective flip chip mounting areas, each VCSEL flip chip including a plurality of electrically conductive contact pads, wherein respective electrically conductive contact pads of each VCSEL flip chip are electrically coupled with respective electrically conductive contact pads disposed in the respective flip chip mounting areas of the upper surface of the substrate, each VCSEL flip chip having at least one VCSEL that produces said particular wavelength of light and an aperture formed in a lower surface of the respective VCSEL flip chip through which the light produced by the VCSEL passes out of the respective VCSEL flip chip, and wherein the VCSEL flip chips are mounted with the apertures facing the upper surface of the substrate such that most if not all of the light passing out of the apertures enters the substrate;
a plurality of encapsulations that extend at least between an outer periphery of each respective VCSEL flip chip and the respective flip chip mounting area disposed on the upper surface of the substrate, the encapsulations comprising an electrically nonconductive material, wherein the encapsulations prevent ingression of contaminants into respective optical pathways between the respective apertures of the respective VCSELs and the upper surface of the substrate; and
a patterned layer of dielectric material on the substrate, wherein the electrically conductive contact pads of the VCSEL flip chips and the electrically conductive contact pads disposed in the respective flip chip mounting areas are electrically coupled with each other via respective metal solder balls or bumps, and
wherein the patterned layer includes a plurality openings aligned with the apertures of the VCSEL flip chips, each of the openings including a dam region, each dam region including a barrier and a reservoir surrounding the barrier that helps prevent the encapsulation material from blocking the optical pathways between the apertures and the substrate.

16. The VCSEL flip-chip assembly of claim 15, further comprising a plurality of optical coupling elements disposed on the lower surface of the substrate in alignment with the respective apertures formed in the lower surfaces of the respective VCSEL flip chips.

17. The VCSEL flip-chip assembly of claim 15, wherein each VCSEL of at least one of the VCSEL flip chips has associated therewith two of the electrically conductive contact pads of the VCSEL flip chip, the two electrically conductive contact pads associated with each VCSEL being formed on the lower surface of the respective VCSEL flip chip through which the light produced by the VCSEL passes out of the respective VCSEL flip chip.

* * * * *